(12) United States Patent
Xiang et al.

(10) Patent No.: US 9,640,781 B2
(45) Date of Patent: May 2, 2017

(54) DEVICES TO INCREASE OLED OUTPUT COUPLING EFFICIENCY WITH A HIGH REFRACTIVE INDEX SUBSTRATE

(71) Applicant: Universal Display Corporation, Ewing, NJ (US)

(72) Inventors: Chaoyu Xiang, Monmouth Junction, NJ (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/631,930

(22) Filed: Feb. 26, 2015

(65) Prior Publication Data

US 2016/0204381 A1 Jul. 14, 2016

Related U.S. Application Data

(60) Provisional application No. 62/101,035, filed on Jan. 8, 2015.

(51) Int. Cl.
*H01L 51/52* (2006.01)
*H01L 51/00* (2006.01)

(52) U.S. Cl.
CPC ...... *H01L 51/5262* (2013.01); *H01L 51/0096* (2013.01); *H01L 51/5203* (2013.01); *H01L 51/5265* (2013.01); *H01L 51/5281* (2013.01); *Y02E 10/549* (2013.01)

(58) Field of Classification Search
CPC .............. H01L 27/3211; H01L 51/5265; H01L 33/405; H01L 2251/558
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,072,620 A | 6/2000 | Shiono et al. |

(Continued)

FOREIGN PATENT DOCUMENTS

| | | |
|---|---|---|
| WO | 2006129265 A2 | 12/2006 |
| WO | 2008057394 | 5/2008 |

(Continued)

OTHER PUBLICATIONS

Baldo, et al., "Highly efficient phosphorescent emission from organic electroluminescent devices", Nature, vol. 395, pp. 151-154, 1998.

(Continued)

*Primary Examiner* — John C Ingham
(74) *Attorney, Agent, or Firm* — Morris & Kamlay LLP

(57) ABSTRACT

Embodiments disclosed herein provide an organic light emitting diode (OLED) device is provided, including a high index substrate having an index of refraction of 1.5 or greater, a reflective electrode, an organic emissive layer configured to emit light having a wavelength of $\lambda$; and where an optical distance between the organic emissive layer and the reflective electrode of the OLED is between $\lambda/4$ and $3\lambda/4$.

18 Claims, 7 Drawing Sheets

(56) References Cited

U.S. PATENT DOCUMENTS

| | | |
|---|---|---|
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,829,087 B2 | 12/2004 | Freese et al. |
| 7,012,363 B2 | 3/2006 | Weaver et al. |
| 7,223,998 B2 * | 5/2007 | Schwach .............. H01L 33/08 257/101 |
| 7,279,704 B2 | 10/2007 | Walters et al. |
| 7,431,968 B1 | 10/2008 | Shtein et al. |
| 7,956,529 B2 * | 6/2011 | Kuma ................ H01L 51/5265 313/483 |
| 7,968,146 B2 | 6/2011 | Wagner et al. |
| 8,232,572 B2 * | 7/2012 | Fukuda ............. H01L 51/5271 257/98 |
| 8,253,157 B2 * | 8/2012 | Jorgenson ........... H01L 33/105 257/98 |
| 8,896,925 B2 | 11/2014 | Han et al. |
| 2003/0230980 A1 | 12/2003 | Forrest et al. |
| 2004/0140758 A1 | 7/2004 | Raychaudhuri et al. |
| 2004/0174116 A1 | 9/2004 | Lu et al. |
| 2010/0033829 A1 | 2/2010 | Wippermann et al. |
| 2010/0181899 A1 | 7/2010 | Forrest et al. |
| 2011/0116014 A1 | 5/2011 | Lee et al. |
| 2011/0248249 A1 * | 10/2011 | Forrest .............. H01L 51/5016 257/40 |
| 2011/0259407 A1 | 10/2011 | Kim et al. |

FOREIGN PATENT DOCUMENTS

| | | |
|---|---|---|
| WO | 2009009695 A1 | 1/2009 |
| WO | 2010011390 | 1/2010 |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Dodabalapur, et al., "Physics and applications of organic microcavity light emitting diodes", Journal of Applied Physics; 80, 6954 (1996).

Meerheim, et al., "Quantification of energy loss mechanisms in organic light-emitting diodes", Applied Physics Letters 97, 253305 (2010).

* cited by examiner

Optical Distance between EML and reflective electrode

DEVICES TO INCREASE OLED OUTPUT COUPLING EFFICIENCY WITH A HIGH REFRACTIVE INDEX SUBSTRATE

CROSS-REFERENCE TO RELATED APPLICATIONS

This application claims the benefit of U.S. Provisional Patent Application Ser. No. 62/101,035, filed Jan. 8, 2015, the disclosure of each of which is incorporated by reference in its entirety. This application is also related to U.S. patent application Ser. No. 14/284,461, filed May 22, 2014, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to improving outcoupling efficiency with a high refractive index substrate with devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

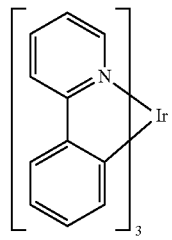

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to an embodiment, an organic light emitting diode (OLED) device is provided, including a high index substrate having an index of refraction of 1.5 or greater, a reflective electrode, an organic emissive layer configured to emit light having a wavelength of $\lambda$; and where an optical distance between the organic emissive layer and the reflective electrode of the OLED is between $\lambda/4$ and $3\lambda/4$.

According to another embodiment, a device can include a high index substrate having an index of refraction of 1.5 or greater, a transparent first electrode, a plurality of layers disposed between the transparent first electrode and a reflective second electrode, the plurality of layers including an organic emissive layer to emit light having a wavelength of $\lambda$, each layer of the plurality of layers having a refractive index $n_i$ and a thickness of $d_i$, where the optical distance $D_{opt}$ between the organic emissive layer and the reflective second electrode is defined by $D_{opt} = \Sigma(i) n_i * d_i$, and where the optical distance between the organic emissive layer and a reflective layer is between $\lambda/4$ and $3\lambda/4$.

According to another embodiment, an organic light emitting diode (OLED) device can include an organic emissive layer (EML), and a reflective electrode, wherein the overall optical distance D between the EML and the reflective electrode is defined by $D = S * \Delta n + D_0$, where S is a shifting factor, $\Delta n$ is a difference of a substrate index (n) and 1.35, and $D_0$ is an optical distance at a first antinode condition.

According to another embodiment, a first device comprising a first organic light emitting device is also provided. The first organic light emitting device can include an anode, a cathode, and an organic layer, disposed between the anode and the cathode. The organic layer can include a high index substrate having an index of refraction of 1.5 or greater, a reflective electrode, an organic emissive layer configured to emit light having a wavelength of $\lambda$; and where an optical distance between the organic emissive layer and the reflective electrode of the OLED is between $\lambda/4$ and $3\lambda/4$. The first device can be a consumer product, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
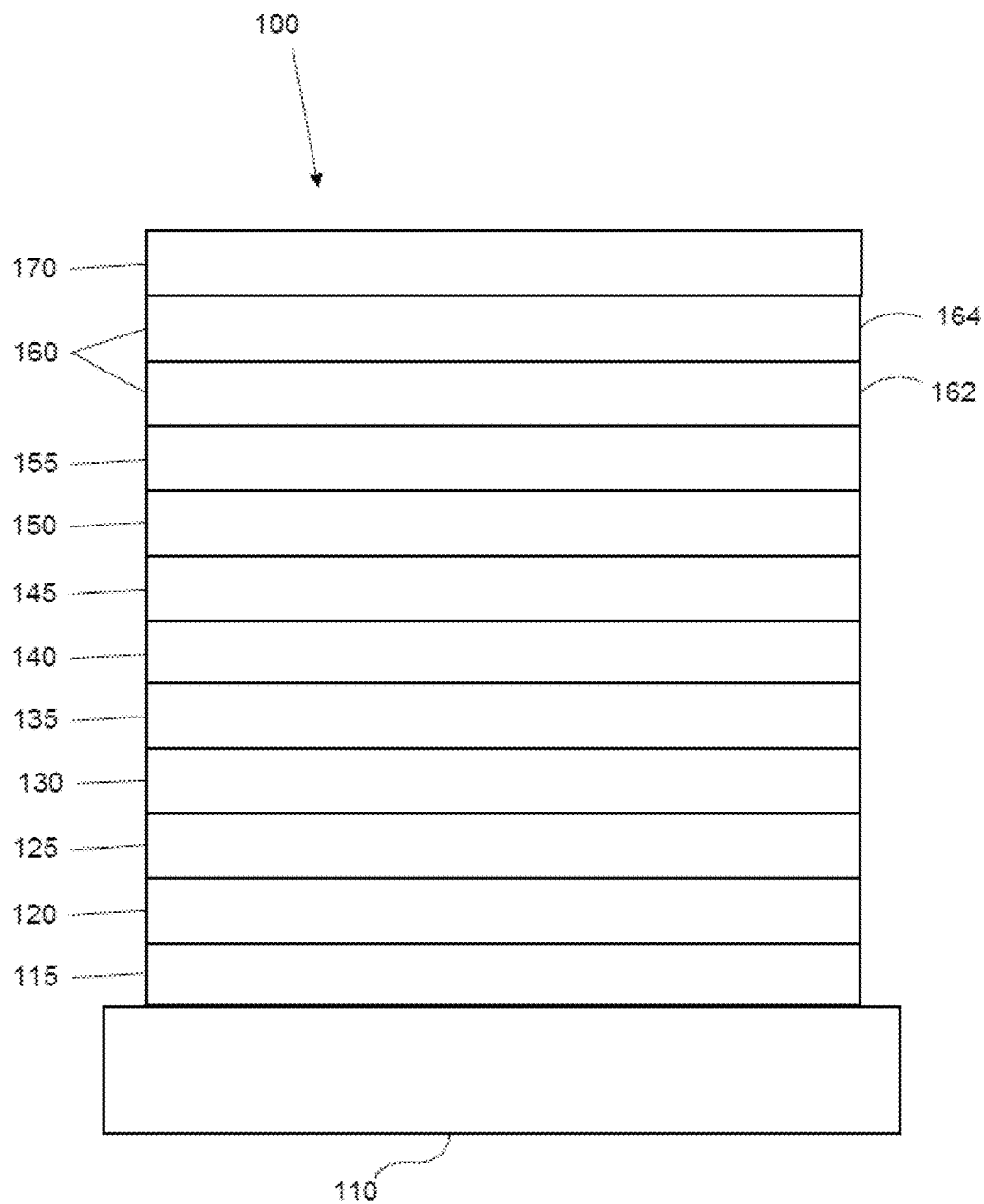
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155. a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
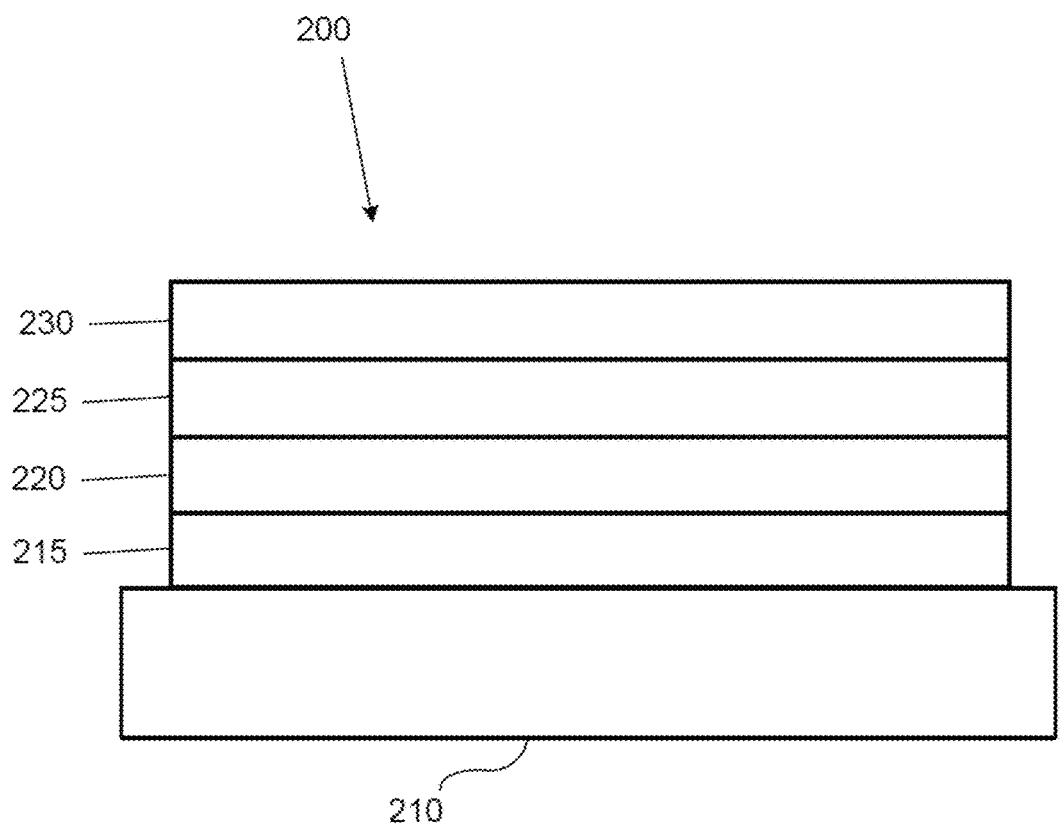
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD). such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20°-25° C.), but could be used outside this temperature range, for example, from −40° C. to +80° C.

Embodiments of the disclosed subject matter are directed to improving a light output coupling efficiency of an OLED device by a combination of high index substrate of the OLED device (e.g., an index of refraction of 1.5 or greater) and an outcoupling component such as a surface topographic modification of the substrate of the OLED device. Light output coupling efficiency may be improved by increasing the optical distance between an emitting layer and a reflective electrode of the OLED device. That is, by increasing this optical distance, more light may be extracted into the substrate of the OLED, and thus the substrate light extraction efficiency can be further improved.

Figure 3A:
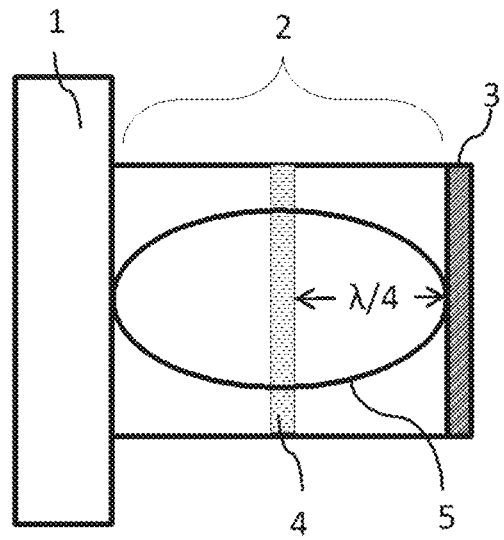
FIG. 3A shows a first anode and FIG. 3B shows an antinode in an OLED device according to an embodiment of the disclosed subject matter.
Figure 4:
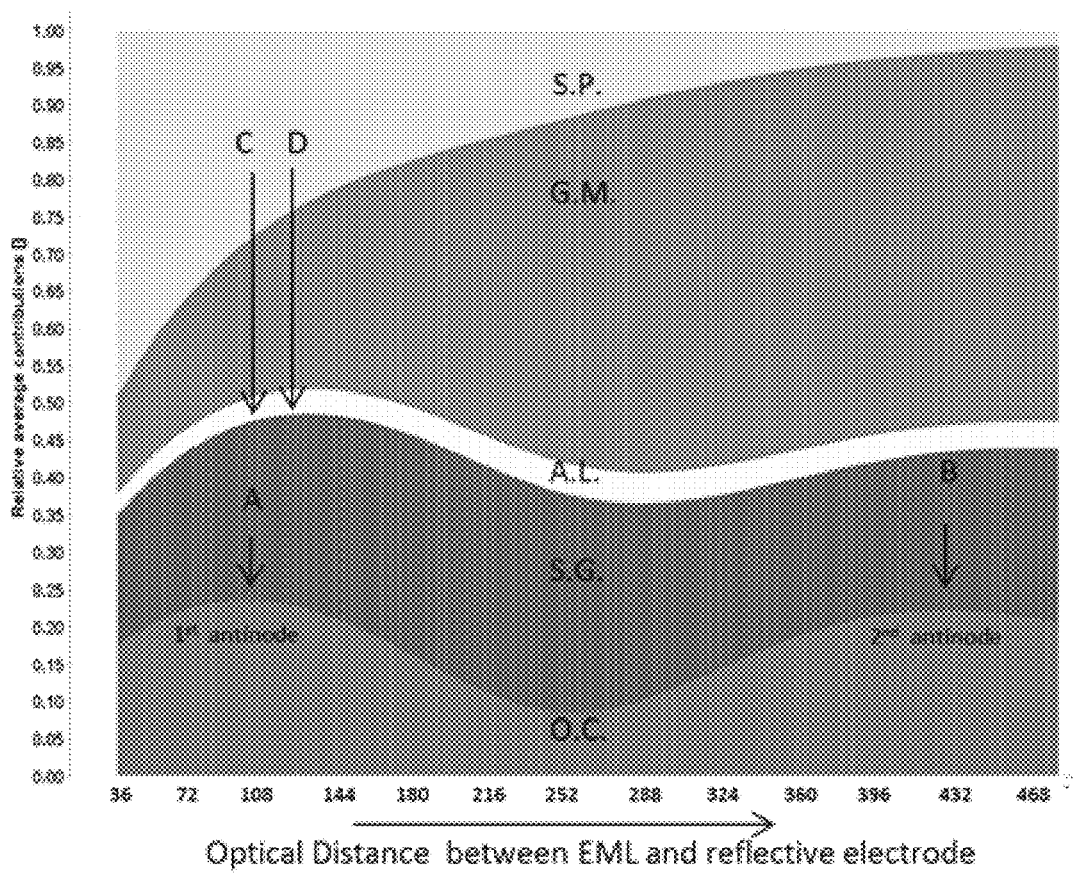
FIG. 4 shows a light distribution of bottom-emitting OLED on a low index substrate versus the optical distance between an electron transport layer (ETL) and a reflective electrode according to an embodiment of the disclosed subject matter.

FIGS. 3A and 4 show a first antinode condition an optical mode distribution. Due to a weak microcavity effect, partial light emitted from an emitting layer (EML) of a conventional OLED (e.g., a bottom-emitting OLED) will feedback into the device. In order to optimize the light output, a constructive interference condition needs to meet. The out coupled intensity of an OLED is proportional to a microcavity factor (A. Dodabalapur, et al *J. Appl. Phys.* 80, 6954 (1996)), as provided by the following equation:

$$\frac{(1-R_s)\left(1+R_m+2\sqrt{R_m}\cos\left(\frac{4\pi D}{\lambda}+\pi\right)\right)}{1+R_mR_s-2\sqrt{R_mR_s}\cos\left(\frac{4\pi L}{\lambda}\right)}$$

where $R_s$ and $R_m$ are the reflectivity of the substrate and reflective electrode respectively, L is the device optical length and D is optical distance between an emissive layer (EML) and a reflective electrode, and $\lambda$ is the emitting wavelength of light. The optical distance is equal to a sum of refractive index, where there may be a plurality of layers, each having a particular thickness, as represented by $D_{opt}=\Sigma n*d$. A microcavity factor approaches and/or reaches a maximum when the device optical length (L) equals to the multiples of half wavelength $$\left(\cos\left(\frac{4\pi L}{\lambda}\right)=1\right).$$

At this condition, light inside of the device forms the standing wave. The minimum wave amplitudes are wave nodes, the first and last of which locate at the both ends of the device. The optical distance between an emitting layer (EML) and a reflective electrode (D) is equal to odd multiples of quarter wavelength $$\left(\cos\left(\frac{4\pi L}{\lambda}+\pi\right)=1\right),$$

which corresponds to the same positions of antinodes, which are the maximum amplitudes of the wave. The shortest device can fit a half wave, where two nodes occur at the ends of the device and only the first antinode existing in the device stays at the position of the emitting layer (EML).

Figure 3B:
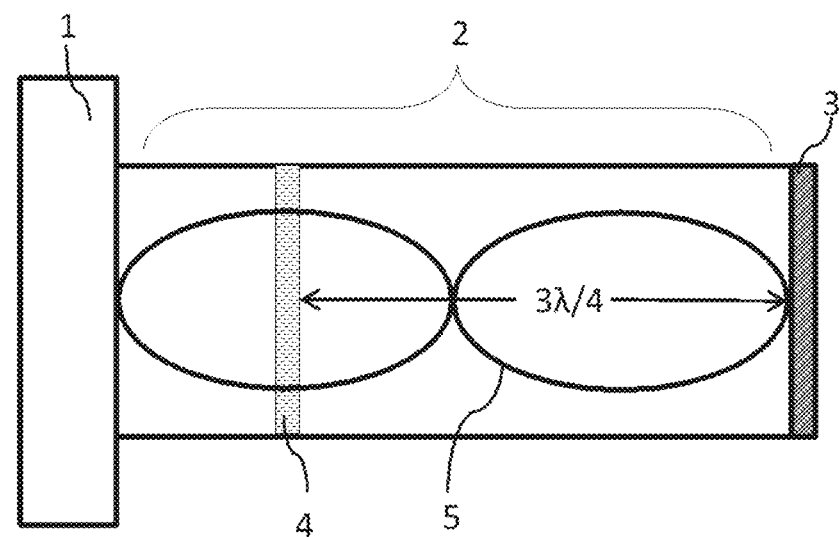

FIGS. 3A-3B show a device including a substrate 1, an organic light emitting diode (OLED) 2, a reflective electrode 3, an emitting layer 4, and a standing wave 5 of the emitted light. The OLED may be optimized at this first antinode condition so as to optimize the light outcoupled from the device.

Choosing an output wavelength for an OLED device may depend upon the application of the OLED device. In a display application for an OLED device, for example, because the emission for an OLED device in an individual sub-pixel typically is a narrow, single peak spectrum, the wavelength may be set as the peak wavelength of the emission. In a lighting application, a broad, multi-peak spectrum is typically selected. However, these are merely examples of wavelength selection for applications, and any wavelength in the spectrum may be considered for a particular application. In some embodiments, the wavelength may be the shortest wavelength in emission.

The first antinode condition is shown in FIG. 4, which illustrates a simulation based on OLED having a low index substrate. The optical distance and index of refraction of the simulation shown in FIG. 4 are a 10 μm substrate (n=1.46), a 120 nm transparent electrode (n=1.9+0.05i), a 55 nm first transporting layer (n=1.8), a 27 nm EML (n=1.8), a second transporting layer (n=1.8) and 100 nm reflective electrode (n=1+6i). The optical distance D is determined by multiplying the thickness of a second transporting layer with its index (1.8). The first antinode condition is shown as point A in FIG. 4, which is a maximum point of an outcoupled (O.C.) mode. This mode indicates the amount of light emitted out of the device without any extracting method being used. In the first antinode condition, only about 25% of generated light is in the O.C. mode. Total internal reflection occurs at the interface of the substrate of the OLED device and air, which holds about 20% of the light in the substrate (S.G. mode). Another 20% of that light may be trapped in the waveguide mode (G.M.) due to the higher index of indium tin oxide (ITO) and organic materials than that of substrate. About 30% of the light is eventually evanescent through a surface plasmon loss at an interface of organic and metal electrode (S.P. mode) of the OLED device.

FIG. 3B and FIG. 4 show a second antinode condition. In the simulation, keeping the rest of the layer thicknesses intact, the intensity of each optical mode (e.g., O.C. mode, S.G. mode, G.M. mode, and the like) can be dependent on the optical distance between the EML and the reflective electrode of the OLED. When the optical distance between the EML and the reflective electrode is increased, such as shown in FIG. 3B (e.g., the optical distance between the reflective layer 3 and the EML 4), a second maximum occurs in the O.C. mode, as identified as point B in FIG. 4. Here, the OLED device doubles its length (compared to first antinode condition shown in FIGS. 3A and 4), allowing two antinodes exist inside as shown in FIG. 3B. The increase in the optical distance between the EML and the reflective electrode may minimize the S.P. mode. That is, the further the EML (e.g., EML 4 as shown in FIGS. 3A-3B) is away from the electrode interface (e.g., the reflective electrode 3), the smaller the energy loss through S.P. mode.

Figure 5:
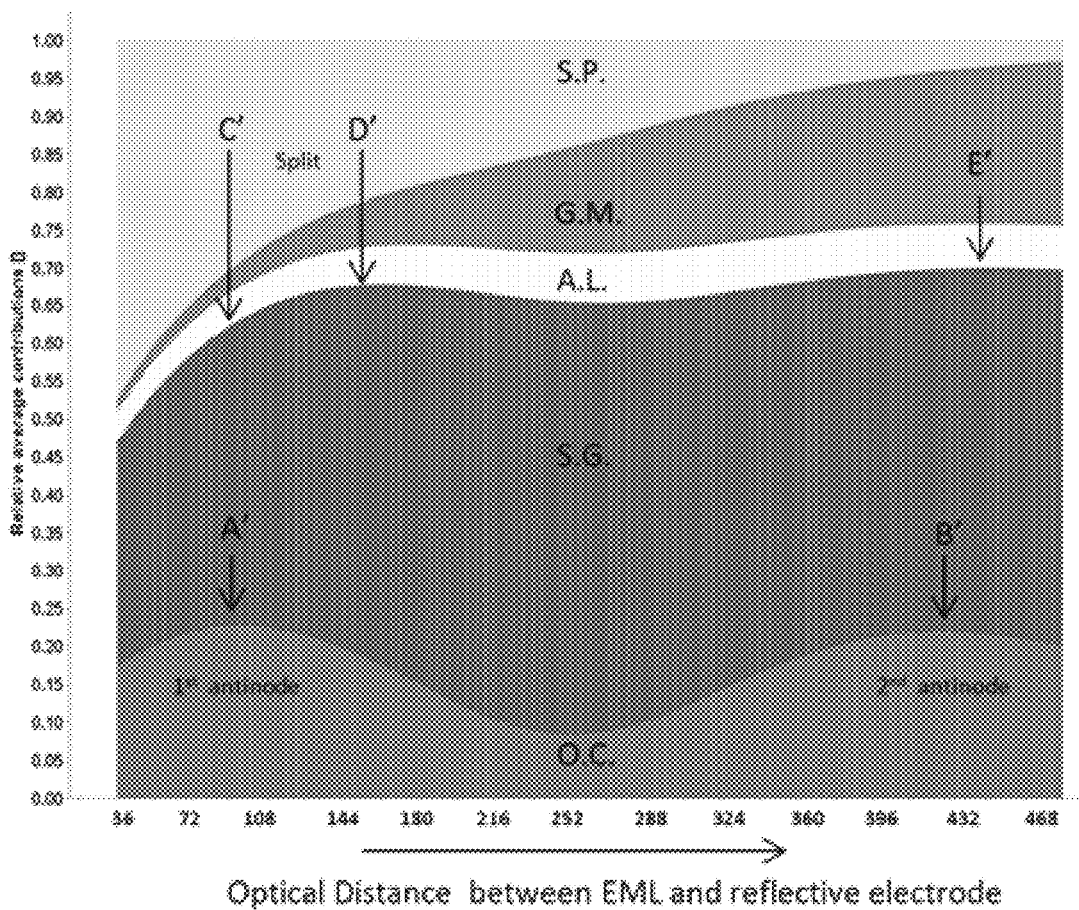
FIG. 5 shows a light distribution of bottom-emitting OLED on a high index substrate versus the optical distance between an electron transport layer (ETL) and a reflective electrode according to an embodiment of the disclosed subject matter.

High refractive index substrates with an index larger than 1.5 may allow for the waveguide effect previously described to occur, and thus extract light from the indium tin oxide (ITO) and organic materials into the substrate (e.g., substrate 1 shown in FIGS. 3A-3B). As shown in FIG. 5, there may be a large increase of the S.G. mode and a decrease of the G.M. mode (e.g., based on the areas of the S.G. mode and G.M. modes illustrated in FIG. 5 relative to the areas of these modes shown in FIG. 4) when a conventional substrate is replaced with a high-index substrate having a refractive index of 1.7. With a spherical lens or topographical features such as a microlens array (MLA) such as described in U.S. Patent Pubn. No. US 2014-0361270, more light may be extracted from high index substrate (e.g., a substrate having an index of refraction of 1.5 or greater) than the low index substrate (e.g., a substrate having an index of refraction that is less than 1.5). When a high index substrate is coupled to an OLED structure, light power distribution may change accordingly. In particular, the light power distribution of the substrate modes may change (e.g., O.C. mode, S.G. mode, G.M. mode, and the like).

Typically, the increase of the S.G. mode at second antinode is larger than that at the first antinode due to the suppression of S.P. mode. See, e.g., R. Meerheim et al, *Applied Physics Letters* 97, 253305 (2010). As such, it is typically reasonable to increase the optical distance in an OLED device and utilize the second antinode condition. However, such a selection increases material costs and power consumption due to the need for a higher driving voltage.

Embodiments of the disclosed subject matter provide an OLED device to minimize and/or avoid one or more of the problems discussed above by finding the maximum of an S.G. mode closest to the first antinode condition. Referring to the low refractive index substrates of FIG. 4, when devices having optical distances (e.g., optical distances between EML and the reflective electrode) at the maximum of O.C. mode (point A) and S.G. mode (point D), there are no significant difference in O.C. plus S.G. modes (points C and D). Thus, an increased and/or maximum improvement may be expected from extracting a substrate mode, without significantly changing the optical distance between the EML and the reflective electrode of the device beyond a predetermined amount. However, with a high index substrate (e.g., a refractive index of 1.5 or greater), the maximum of these two modes (O.C. and S.G. modes) is split (e.g., points A' and D' shown in FIG. 5).

Comparing FIG. 4 with FIG. 5, the maximum of the S.G. mode (point D') shifts to a longer optical thickness (e.g., an increased optical distance between the EML and the reflective electrode). An OLED with this thickness may have a higher S.G. mode than a device at first antinode (point C'). Moreover, this maximum is close to a first antinode condition (point D') which shows a similar value as the maximum at the second antinode condition (point E'). Therefore, instead of doubling the device thickness (e.g., increasing the optical distance between the EML and the reflective electrode) to the second antinode condition, there is another optimal condition close to the first antinode that may provide a reduced device thickness (i.e., a reduced optical distance). The higher the index of refraction is (e.g., the index of refraction of the substrate of the OLED device), the more effectively one can utilize this condition by extracting S.G. mode.

Figure 6:
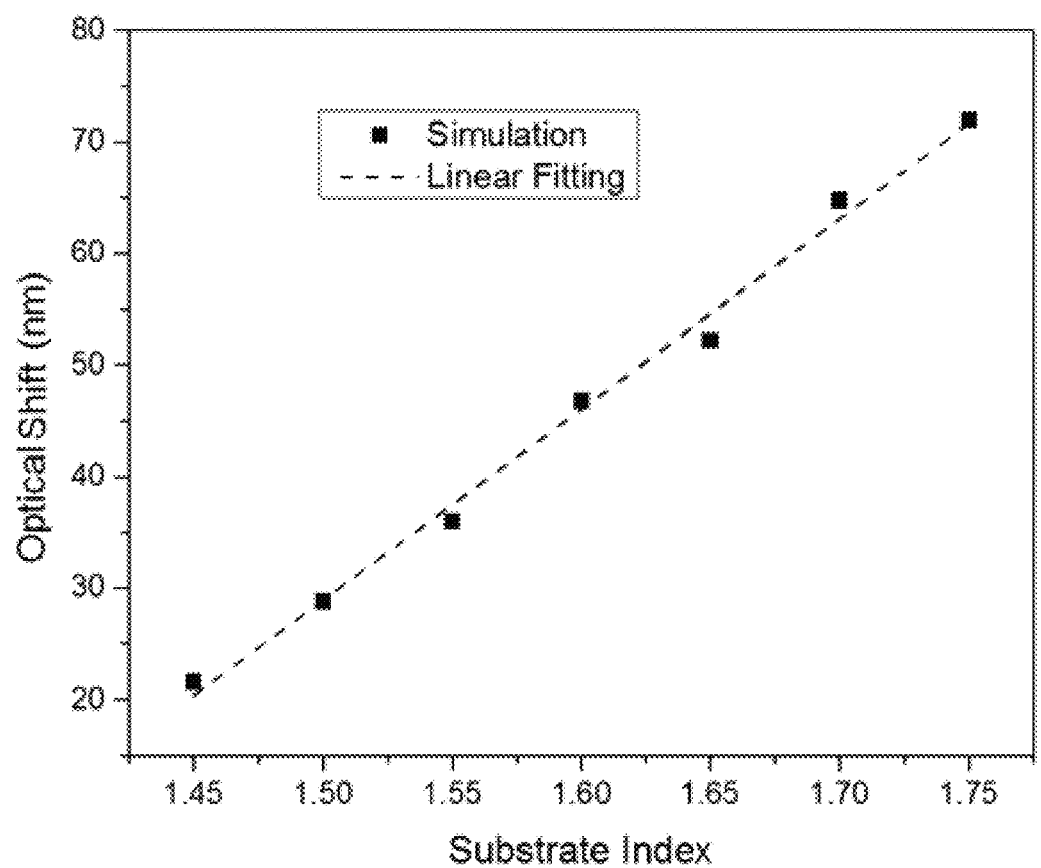
FIG. 6 shows a relation between an index change versus the optical distance shift of an S.G. mode (holding 20% of light in the substrate) regarding a first antinode according to an embodiment of the disclosed subject matter.

In order to determine this condition, a relationship may be established between the index and the maximum peak shift of the S.G. mode regarding the first antinode. FIG. 6 illustrates a simulation based on a plurality of index values and their relation with an optical distance shift. The fitting (i.e., the dashed line in FIG. 6 between the simulation points) indicates a linear relationship between index and S.G. mode maximum shift. A new parameter, known as a shifting factor (S), may be defined as follows:

$$S = \Delta D / \Delta n$$

where $\Delta D$ is the optical distance increase regarding the first antinode, $\Delta n = n - n_0$ is the difference of the substrate index (n) regarding no. As shown in FIG. 6, S and no may be fit as 170±10 (nm) and 1.35±0.1, respectively. That is, $\Delta n$ may be the difference between a substrate index n and 1.35. The shifting factor parameter (S) may indicate the extra optical distance needed in addition to the first antinode condition in order to take advantage of the maximum of the extracted S.G. mode. The overall optical distance between EML and reflective electrode may have a linear dependence on the substrate index difference:

$$D = S^* \Delta n + D_0 \qquad \text{Equation 1}$$

where D is the optical distance, S is a shifting factor, $\Delta n$ is a difference of the substrate index (n) and 1.35, and Do is an optical distance at a first antinode condition.

In an OLED device (e.g., a bottom emitting OLED device), there may be different functional layers such as a planarization layer, a moisture/oxygen barrier layer, and/or a scattering layer disposed on the substrate before OLED. Descriptions and locations of the different layers may be found in U.S. Pat. No. 7,012,363, the disclosure of which is incorporated herein by reference. One or more of the functional layers may have different refractive indexes. Thus, the effective index (ñ) of a complex substrate including all layers before the OLED may considered.

For example, an effective index ($\bar{n}$) may be defined as:

$$\bar{n} = n + \sum_i (n_i - n) * \frac{L_i}{L}$$ Equation 2 where n is the index of the substrate, $n_i$ is index of other functional layer, $L_i$ is the thickness of other functional layer and L is the thickness of substrate. Equation 2 considers the weight average of indexes of all of the different functional layers and the substrate. Hence, the index difference in Equation 1 becomes $\Delta n = \bar{n} - n_0$. This index difference may be larger than 0.1, so that the effective index of refraction of the substrate is larger than that of glass (i.e., 1.46). For example, a high index substrate (n=1.7) may include a low-index barrier layer (e.g., 1 μm, n=1.45), $n_i$=1.68, as well as a high-index barrier (e.g., a 200 nm barrier with n=2.2), $n_i$=1.71.

Figure 7:
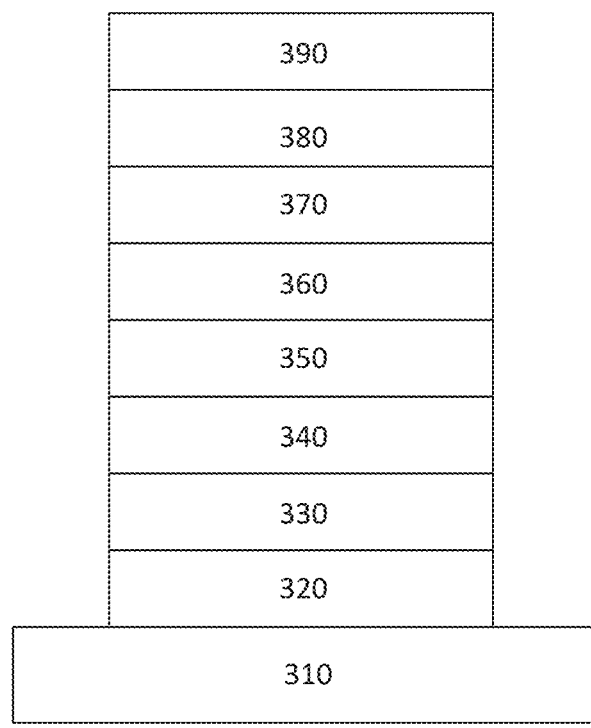
FIG. 7 shows a structure of an OLED device disposed on a high-index substrate according to an embodiment of the disclosed subject matter.

FIG. 7 shows an OLED device 300 disposed on top of high index substrate 310 (e.g., where the index of refraction is 1.5 or greater). For example, the high index substrate 310 may include a material such as sapphire, high index glass, plastic, and/or polymer, and may include, for example, polymer and/or nanoparticle blenders (i.e., a polymer and nanoparticle blend). The OLED device 300 may include a transparent anode 320, a hole injection layer (HIL) 330, a hole transporting layer (HTL) 340, an electron blocking layer (EBL) 350, a light EML 360; a hole blocking layer (HBL) 370; an electron transporting layer (ETL) 380, and a cathode 390. The EML 360 may include one or more emitters for different color emission (e.g., emitters that emit different color light). In a device that emits white light, the thicknesses and refractive index (n) of each layer may include a 10 μm substrate (n=1.7), 120 nm transparent anode (n=1.9+0.05i), 10 nm HIL (n=1.8), 45 nm HTL (n=1.8), 27 nm EML (n=1.8), 5 nm HBL (n=1.8), 45 nm ETL(n=1.8) and 100 nm reflective cathode (n=1+6i). Knowing the index of each layer, the optical distance $D_{opt}$ between the EML 360 and the reflective barrier (e.g., cathode 390) is controlled by the thickness of the ETL 380 in the OLED device 300 by $D_{opt} = \Sigma n*d$, where n and d are the refractive index and thickness of each layer. The surface plasmon loss may be reduced with the increased distance between EML (e.g., EML 360) and reflective electrode (e.g., cathode 390). That is, the surface plasmon loss may be reduced with the increase in thickness of the ETL 380. Due to the relatively high conductivity of transporting layer (e.g., HTL 340 or ETL 380), a small increase of the layer thickness only increases driving voltage slightly.

In view of the above, in an embodiment of the disclosed subject matter, an organic light emitting diode (OLED) device can include a high index substrate having an index of refraction of 1.5 or greater, a reflective electrode, an organic emissive layer configured to emit light having a wavelength of λ, and where an optical distance between the organic emissive layer and the reflective electrode of the OLED is between λ/4 and 3λ/4.

The device can include a range of the optical distance between the organic emissive layer and the reflective electrode that is 5% to 50% larger than λ/4, and/or 5% to 10% shorter than 3λ/4. The wavelength λ of the emitted light can have a peak wavelength of an emission spectrum of the emitted light. The wavelength of emitted light can be a shortest wavelength in an emission spectrum of the emitted light.

The high index substrate of the device can be a flexible substrate. In some embodiments, the flexible substrate can be plastic. The high index substrate of the OLED of the device can include a material such as sapphire, high index glass, plastic, high index polymer, and a polymer and nanoparticle blend.

The device can includes at least one layer that may be a cathode, an electron injection layer (EIL), an electron transport layer (ETL), a hole blocking layer (HBL), a hole transport layer (HTL), a hole injection layer (HIL), an anode, a moisture barrier layer, a gas barrier layer, a planarization layer, and a scattering layer. The at least one layer can have a high index of refraction that is 1.5 or greater.

In some embodiments, the device can include an outcoupling component to extract the emitted light from the high index substrate.

The optical distance between the organic emissive layer and the reflective electrode of the device can be linearly dependent upon a refractive index of a substrate of the OLED. Alternatively, the optical distance between the organic emissive layer and the reflective electrode is linearly dependent upon a shifting factor. In some embodiments, the optical distance between the organic emissive layer and the reflective electrode can be increased by less than 80 nm. The optical distance between the organic emissive layer and the reflective electrode of the OLED is according to the respective indices of refraction.

In another embodiment of the disclosed subject matter, a device may include a high index substrate having an index of refraction of 1.5 or greater, a transparent first electrode, a plurality of layers disposed between the transparent first electrode and a reflective second electrode, the plurality of layers including an organic emissive layer to emit light having a wavelength of λ, each layer of the plurality of layers having a refractive index $n_i$ and a thickness of $d_i$, where the optical distance $D_{opt}$ between the organic emissive layer and the reflective second electrode is defined by $D_{opt} = \Sigma(i) \, n_i * d_i$, and where the optical distance between the organic emissive layer and a reflective layer is between λ/4 and 3λ/4.

The device of this embodiment can include an inverted organic light emitting diode (OLED) disposed on the high index substrate including the organic emissive layer to emit light at the wavelength λ, and a transporting layer adjacent to the reflective layer, where an optical distance between the organic emissive layer and reflective layer is dependent on the thickness of the transport layer and its corresponding refractive index.

The OLED of the device of this embodiment can include at least one layer, such as a cathode, an electron injection layer (EIL), an electron transport layer (ETL), a hole blocking layer (HBL), a hole transport layer (HTL), a hole injection layer (HIL), an anode, a moisture barrier layer, a gas barrier layer, a planarization layer, and a scattering layer. The device can have an index of refraction of the at least one layer is 1.5 or greater.

The high index substrate of the device of this embodiment can be, for example, sapphire, high index glass, plastic, a polymer, and a polymer and nanoparticle blend. The high index substrate can be a flexible substrate.

The device of this embodiment can include an outcoupling component to extract the emitted light from the high index substrate.

In another embodiment of the disclosed subject matter, an organic light emitting diode (OLED) device can have an organic emissive layer (EML) and a reflective electrode, where the overall optical distance D between the EML and the reflective electrode is defined by $D=S*\Delta n+D_0$, where S is a shifting factor, $\Delta n$ is a difference of a substrate index (n) and 1.35, and $D_0$ is an optical distance at a first antinode condition. In some embodiments, the shifting factor S may be a positive number greater than zero, $\Delta n$ may be a positive number greater than 0.15.

The organic emissive layer of the OLED of this embodiment may emit light at wavelength $\lambda$ and the optical distance $D_0$ is $\lambda/4$.

The device of this embodiment may have a high index substrate having an index of refraction of 1.5 or greater. The high index substrate can include a flexible substrate.

The device of this embodiment can include at least one layer, such as a cathode, an electron injection layer (EIL), an electron transport layer (ETL), a hole blocking layer (HBL), a hole transport layer (HTL), a hole injection layer (HIL), an anode, a moisture barrier layer, a gas barrier layer, a planarization layer, and a scattering layer. The device can include an outcoupling component to extract the emitted light from the high index substrate.

EXPERIMENTAL

Thicker ETLs may be included with OLED devices with different barriers between substrate and an indium tin oxide (ITO) layer. For example, for a low index barrier with a thickness of 1 µm and an index of 1.5, the effective index is 1.68. An OLED with a 31 nm thicker ETL may be needed. The OLED utilizing the thicker ETL layer may have a larger enhancement in efficiency than the device without the increased ETL thickness. Table 1 shows the calculated device performance with increased ETL thickness by assuming 66.3% extracting efficiency of S.G. mode. This efficiency may be realized by a microlens array (MLA) as disclosed in U.S. patent application Ser. No. 14/284,461. At the first antinode condition of O.C. mode without thickness increase, the enhancement from extracting S.G. mode is 66.3% on EQE (external quantum efficiency). With a 31 nm ETL thickness increase, EQE enhanced with extraction of the S.G. mode, the peak EQE enhancement of 93.8% occurred.

TABLE 1

Calculated OLED performance with different ETL thicknesses

| | $\Delta$d ETL(nm) | | |
|---|---|---|---|
| | 0 (O.C only) | 0 (extract S.G.) | 31 (extract S.G.) |
| EQE (%) | 24.1 | 40.1 | 46.7 |

A high refractive index barrier with a thickness of 200 nm and an index of 2.2 may be inserted between transparent anode and substrate. A better index matching between OLED and substrate can be realized with a high index barrier. In this example, given the effective substrate index of 1.71, the increase of ETL may be calculated as 34 nm. Assuming 94% extracting efficiency of S.G. mode, an efficiency enhancement is calculated as shown in Table 2. The EQE may increase 122%, with the ETL thickness increase of 34 nm, by extracting more of the S.G. mode light.

TABLE 2 calculated performance of OLED with high index barrier with different ETL thicknesses

| | $\Delta$d ETL(nm) | | |
|---|---|---|---|
| | 0 (O.C only) | 0 (extract S.G.) | 31 (extract S.G.) |
| EQE (%) | 22.3 | 43.3 | 49.7 |

The thickness of a transport layer disposed adjacent to a reflective electrode in an OLED device (e.g., an inverted OLED) on a high index substrate can be increased. Such an OLED device may include: a high index substrate which may include sapphire, high index glass, plastic, polymer and/or polymer/nanoparticle blenders (i.e., a polymer and nanoparticle blend), a transparent cathode, an electron injection layer (EIL); an ETL; a HBL; an EML; a HTL; a HIL and an anode (e.g., a reflective metal may serve as the anode). The optical distance may be dependent on the thickness of the HTL, as the index of this layer is known.

After extracting the S.G. mode from an OLED device having a high index substrate (e.g., a bottom-emitting OLED), further enhancement can be realized by an increase of the optical distance between EML and reflective electrode in connection with the first antinode condition. This increase ($\Delta D$) has a linear dependency on the complex refractive index of the substrate (f) and the shifting factor (S).

From this experiment, in may be determined that OLEDs disposed on a high index substrate (e.g., bottom-emitting OLEDs) may have an increase of the optical distance between EML and reflective electrode related to the first antinode condition to further enhance the substrate mode extracting efficiency The first antinode condition ($D_0$) may be determined by a microcavity factor. Under this condition, the optical thickness of the OLED device may be equal to a half wavelength and the optical distance between EML and reflective electrode is a quarter wavelength. The light emitting into air is maximum without any outcoupling method.

The increase of the optical distance may be linearly dependent on the effective index of the substrate according to:

$$\Delta D = S*\Delta n, \text{ where } \Delta n = n-1.35,$$

The increase of the optical distance may be 80 nm or less. The overall optical distance between EML and reflective electrode may be represented as:

$$D=S*\Delta n+D_0$$

An area between the EML and reflective electrode may include one or more different functional layers such as transporting layer, blocking layer, injecting layer, optical spacing layer, light enhancement layer. The optical distance may depend on the physical distance between EML and reflective electrode once the index of each layer is known. The high index of the substrate as referred to throughout may be defined as substrate having an effective substrate index that is larger than 1.5, which means the $\Delta n>0.15$. Materials of a high index substrate may include sapphire, high index glass, plastic, high index polymer or polymer/nanoparticle blender (i.e., a polymer and nanoparticle blend). The overall substrate may include different functional layers before an indium tin oxide (ITO) layer. One sample of the effective index may be represented as the following:

$$\bar{n} = n + \sum_i (n_i - n) * \frac{L_i}{L}$$

The realization of higher efficiency enhancement with the optical distance increase is valid by the extraction of S.G. mode by substrate surface modification such as a MLA.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting diode (OLED) device comprising:
   a high index substrate having an index of refraction of 1.5 or greater;
   a reflective electrode; and
   an organic emissive layer configured to emit light having a wavelength of $\lambda$,
   wherein an optical distance between the organic emissive layer and the reflective electrode of the OLED is greater than $\lambda/4$ and less than $3\lambda/4$, and wherein a range of the optical distance between the organic emissive layer and the reflective electrode is selected from the group consisting of: 5% to 50% larger than $\lambda/4$ and 5% to 10% shorter than $3\lambda/4$.

2. The device of claim 1, wherein $\lambda$ is a peak wavelength of an emission spectrum of the emitted light.

3. The device of claim 1, wherein $\lambda$ is a shortest wavelength in an emission spectrum of the emitted light.

4. The device of claim 1, wherein the high index substrate comprises a flexible substrate.

5. The device of claim 4, wherein the flexible substrate is plastic.

6. The device of claim 1, wherein the device includes at least one layer from the group consisting of: a cathode, an electron injection layer (EIL), an electron transport layer (ETL), a hole blocking layer (HBL), a hole transport layer (HTL), a hole injection layer (HIL), an anode, a moisture barrier layer, a gas barrier layer, a planarization layer, and a scattering layer.

7. The device of claim 6, wherein the at least one layer has a high index of refraction that is 1.5 or greater.

8. The device of claim 1, further comprising an outcoupling component to extract the emitted light from the high index substrate.

9. The device of claim 1, wherein the optical distance between the organic emissive layer and the reflective electrode is linearly dependent upon a refractive index of a substrate of the OLED.

10. The device of claim 1, wherein the optical distance between the organic emissive layer and the reflective electrode is linearly dependent upon a shifting factor.

11. The device of claim 1, wherein the optical distance between the organic emissive layer and the reflective electrode is increased by less than 80 nm.

12. The device of claim 1, wherein the optical distance between the organic emissive layer and the reflective electrode is determined by:

$$D = S * \Delta n + D_0$$

wherein D is the optical distance, S is a shifting factor, $\Delta n$ is a difference of the substrate index (n) and 1.35, and $D_0$ is an optical distance at a first antinode condition.

13. The device of claim 1, wherein the optical distance between the organic emissive layer and the reflective electrode of the OLED is according to the respective indices of refraction.

14. The device of claim 1, wherein the high index substrate of the OLED comprises a material selected from the group consisting of: sapphire, high index glass, plastic, high index polymer, and a polymer and nanoparticle blend.

15. A device comprising:
    a high index substrate having an index of refraction of 1.5 or greater;
    a transparent first electrode; and
    a plurality of layers disposed between the transparent first electrode and a reflective second electrode, the plurality of layers including an organic emissive layer to emit light having a wavelength of $\lambda$, each layer of the plurality of layers having a refractive index $n_i$ and a thickness of $d_i$,
    wherein the optical distance $D_{opt}$ between the organic emissive layer and the reflective second electrode is defined by $D_{opt} = \Sigma(i) n_i * d_i$, and
    wherein the optical distance between the organic emissive layer and a reflective layer is greater than $\lambda/4$ and less than $3\lambda/4$, and wherein a range of the optical distance between the organic emissive layer and the reflective electrode is selected from the group consisting of: 5% to 50% larger than $\lambda/4$ and 5% to 10% shorter than $3\lambda/4$.

16. The device of claim 15, further comprising an outcoupling component to extract the emitted light from the high index substrate.

17. An organic light emitting diode (OLED) device comprising:
    an organic emissive layer (EML); and
    a reflective electrode,
    wherein the overall optical distance D between the EML and the reflective electrode is defined by $D = S * \Delta n + D_0$,
    wherein S is a shifting factor is a positive value between 160nm-180nm, $\Delta n$ is a difference of a substrate index (n) and 1.35, and $D_0$ is an optical distance at a first antinode condition.

18. The OLED device of claim 17, wherein $\Delta n$ is a positive number greater than 0.15.

* * * * *